US011469058B2

(12) United States Patent
Faude

(10) Patent No.: US 11,469,058 B2
(45) Date of Patent: Oct. 11, 2022

(54) SLIDING SWITCH CONTACT STRUCTURE

(71) Applicant: Elrad Electronics d.o.o., Gornja Radgona (SI)

(72) Inventor: Rudolf Faude, Balingen (DE)

(73) Assignee: Elrad Electronics d.o.o.

( * ) Notice: Subject to any disclaimer, the term of this patent is extended or adjusted under 35 U.S.C. 154(b) by 0 days.

(21) Appl. No.: 17/263,584

(22) PCT Filed: May 15, 2019

(86) PCT No.: PCT/EP2019/062436
§ 371 (c)(1),
(2) Date: Jan. 27, 2021

(87) PCT Pub. No.: WO2020/035182
PCT Pub. Date: Feb. 20, 2020

(65) Prior Publication Data
US 2021/0304976 A1    Sep. 30, 2021

(30) Foreign Application Priority Data

Aug. 13, 2018  (DE) ..................... 10 2018 119 642.3

(51) Int. Cl.
*H01H 9/06*     (2006.01)
*H01H 1/14*     (2006.01)
*H05K 1/18*     (2006.01)

(52) U.S. Cl.
CPC ................ *H01H 9/06* (2013.01); *H01H 1/14* (2013.01); *H05K 1/18* (2013.01); *H05K 2201/10053* (2013.01)

(58) Field of Classification Search
CPC .............. H01H 9/06–1/14; H01H 9/36; H01H 9/44–19/11; H05K 1/18–2201/10053; E05Y 2400/854
See application file for complete search history.

(56) References Cited

U.S. PATENT DOCUMENTS

| 6,979,786 | B2 * | 12/2005 | Aukland | .................. | H01H 9/38 |
| | | | | | 200/16 R |
| 2015/0332876 | A1 * | 11/2015 | Kikuchi | ................. | H01H 15/10 |
| | | | | | 200/16 R |
| 2016/0189886 | A1 * | 6/2016 | Terasawa | ................. | H01H 1/06 |
| | | | | | 200/252 |

FOREIGN PATENT DOCUMENTS

DE     102006011930 B3     2/2007
DE     102012012176 A1    12/2013
(Continued)

OTHER PUBLICATIONS

International Search Report of corresponding PCT/EP2019/062436, dated Jul. 16, 2019, 13 pages (not prior art).
(Continued)

*Primary Examiner* — Vanessa Girardi
(74) *Attorney, Agent, or Firm* — Lucian Wayne Beavers; Patterson Intellectual Property Law, PC

(57) ABSTRACT

The invention relates to an electrical switch (30) for an electrical appliance (2), in particular for a power tool, which has at least two switching contacts (34, 36), which can be jointly moved between a switched-off position (38), in which the switching contacts (34, 36) have no electrical connection to a counter contact (42) of the switch (30), and a switched-on position (40), in which the switching contacts (34, 36) are electrically connected to the counter contact (42). To maintain a contact resistance of the switch (30) at a largely constant value over the service life, it is proposed to arrange and/or design the switching contacts (34, 36) and/or the counter contact (42) such that, when the switch (30) transitions between the switched-off position (38) and the switched-on position (40), the switching contacts (34, 36) successively enter into electrical contact with the counter contact (42) or successively break the electrical contact.

20 Claims, 7 Drawing Sheets

(56) References Cited

FOREIGN PATENT DOCUMENTS

| | | |
|---|---|---|
| EP | 1873800 A1 | 1/2008 |
| JP | 62144017 A | 6/1987 |
| JP | 63009717 A | 1/1988 |

OTHER PUBLICATIONS

Office Action dated Nov. 29, 2019 in corresponding German Appl. 102018119642.3, 5 pages (not prior art).

* cited by examiner

SLIDING SWITCH CONTACT STRUCTURE

This invention relates to an electric switch for an electric appliance, in particular for a power tool, which has at least two jointly movable switching contacts, which can be moved between a switched-off position, in which the switching contacts have no electrical connection to a counter contact of the switch, and a switched-on position, in which the switching contacts have an electrical connection with the counter contact.

Furthermore, the invention relates to an electrical appliance, in particular an electrical tool, having such a switch.

The switch is preferably designed as a slide switch, wherein the switch has a slider having the at least two switching contacts. The switch may have a regulator for adjusting a current supply to an electrical load, in particular for adjusting a rotational speed of an electric motor of an electrical appliance. In particular, the switch is preferably designed as a signal switch that does not directly switch a supply current of the electric motor, but indirectly via control electronics of the electric appliance. The switch then only switches a lower signal current, which is used to control the control electronics, which in turn switches the relatively high supply current of the electric motor as a function of the signal current. The control electronics are used, for instance, to control a brushless (collectorless) motor (so-called BLAC or BLDC motor).

When the switch uses control electronics to indirectly switch the electrical load, the signal current is in a range from approx. 0.1 to 20 mA. However, the control electronics may have a capacitor, in particular an electrolytic capacitor, which first has to be charged when several consecutive switching cycles are switched on for the first time. The charging current can reach values above 1.0 A, depending on the size of the capacitor and how fast the load should respond after the switch is turned on. However, high inrush currents cause contact erosion (also known as material migration) on a contact surface of the counter contact, in particular if the counter contact is formed as a relatively thin conductive track (typically having a layer thickness of between 35 and 70 μm) on a printed circuit board. Contact erosion results in material transference at the contact surface of the counter contact and to an extension of the contact travel. In addition, for the known switches, where both switching contacts switch at the same time, both switching contacts are equally contaminated, resulting in sporadic contact uncertainties and a higher contact resistance. All in all, the extension of the contact travel and the stability of the contact resistance over the lifetime of the switch is a problem with the known switches.

Such a switch is known from EP 1 873 800 A1, for instance. To ensure a safe contact between the slider having the switching contacts and a counter contact designed as a conductive track on a printed circuit board, the known switch has several, in particular two, switching contacts (so-called double-slider contact). When establishing or interrupting the electrical contact between the slider and the conductive track in the area of a switch point, switching sparks, electric arcs and harmful electroerosion (e.g., contact erosion) can occur, in particular if the currents to be switched are relatively large (e.g., 1 A and more). With the known switches, both switching contacts in the switch point make or break contact simultaneously, i.e., switching sparks, arcs and electrical erosion occur equally at both switching contacts or at the matching contact areas of a run-up contour of the conductive track. Contact erosion can cause longer contact travel in an undesirable way. In addition, contact erosion can result in the reduction of the service life or of the switching capacity (number of switching cycles on load) and an increase in the contact resistance of the switch.

Based on the described state of the art, this invention addresses the problem of improving the service life and switching capacity of a switch having several switching contacts and of keeping the electrical properties of the switch, in particular the contact resistance and the switch-on travel, as constant as possible over the entire service life of the switch.

To solve this problem, it is proposed, starting from the switch of the type mentioned above, to arrange and/or design the switching contacts and/or the counter contact such that, when the switch transitions between the switched-off position and the switched-on position at a switch point, the switching contacts successively enter into electrical contact with the counter contact or successively break the electrical contact.

The switching contacts of the switch are preferably part of a slider and are interconnected in an electrically conductive manner. In contrast to the state of the art, where all switching contacts of the switch simultaneously make electrical contact with the counter contact, in this invention that process is successive or gradual. Successive in this context means that at the switch point, first an electrical connection is made between a first switching contact and the counter contact, thus closing the switch. Only when this electrical connection has been made and the switch is closed another switching contact makes contact with the counter contact. Sparks, electric arcs and electroerosion can therefore only occur between the first switching contact and a matching contact area of the counter contact. When the further switching contact makes contact with the matching contact area of the counter contact, the switch is already closed, i.e., no sparks, arcs or electric discharge can occur at the further switching contact or the matching contact area of the counter contact. The additional switching contact can thus ensure a constant contact resistance of the closed switch for its entire service life. The arrangement and/or design of the switching contacts and/or the counter contact of the switch is therefore such that, over the intended service life of the switch, electroerosion only occurs at the first switching contact and the matching contact area of the counter contact and no electroerosion occurs at any other switching contacts. In this way, a long-term reliable function of the switch, in particular a constant contact resistance, can be ensured despite electroerosion at one of the switching contacts or the matching contact area of the counter contact.

This invention can be implemented in many ways. For instance, the arrangement of the switching contacts with respect to a direction of motion of the switch when closing or opening the switch, the design of the switching contacts or their switch surfaces they use to make contact with the matching contact areas of the counter contact, or the arrangement and/or design of the contact areas (or a contact surface) of the counter contact can be varied and matched to each other. To implement the successive contacting of the switching contacts, the switching contacts and the counter contact or its contact surface at the switch point are inter-coordinated.

The switch is particularly suitable for use in an electrical appliance, in particular in a power tool. The switch is designed as a signal switch, which interacts with control electronics of the electrical appliance and switches a relatively low signal current (e.g., smaller than 100 mA, in particular 0.1-20.0 mA) for the control electronics, which in turn switches a significantly higher supply current (e.g., more than 2 A, in particular 4-10 A) for an electrical load of the electrical appliance, in particular an electric motor of the power tool. In an electrical appliance, the implementation of a high switching capacity of the switch is of particular importance, as this can increase the service life of the entire electrical appliance. Furthermore, a contact resistance that remains constant over the entire service life of an electrical appliance is of great importance, as this is the only way to ensure that the electrical appliance operates under constant conditions.

According to a particularly preferred further development of the invention, the switch has a regulator for adjusting a current supply to the electrical load of the electrical appliance, in particular for adjusting a rotational speed of an electric motor of the electrical tool. The controller is used to set the power supply when the switch is turned on. The same actuating element of the switch is used to first switch on the electrical appliance and then vary the rotational speed of the motor. The actuating element is designed, for instance, as a slide or a rotary knob.

According to a preferred embodiment of the invention, it is proposed that the switching contacts are spaced apart in a first plane. The first plane extends, for instance, in parallel to an extension plane of a flat counter contact and in parallel to a direction of motion of the switch (when traveling between the switched-off and the switched-on position). To close the switch, the switching contacts are pushed in the direction of motion across the run-up surface onto the surface of the counter contact. The switching contacts are also aligned in a second plane, which is transverse or slanted to the direction of motion of the switch and perpendicular to the first plane. The counter contact has a run-up contour on its end facing the switched-off position, which extends in a third plane transversely or aslant to the direction of motion of the switch and perpendicular to the first plane. The second plane extends aslant to the third plane.

Because according to this design the switching contacts have a different orientation from that of the run-up contour of the counter contact when viewed in the direction of motion of the switch, the switching contacts successively make contact with the run-up contour or the counter contact. It would be conceivable, for instance, in a first configuration that the second plane, in which the switching contacts are aligned, extends transversely to the direction of motion of the switch. The third plane, in which the run-up contour of the counter contact is located, would then be arranged aslant to the direction of motion of the switch. To close the switch, a first switching contact would first make contact with a first contact area of the slanted run-up contour, which projects further in the direction of the switched-off position of the switch, before the other switching contacts make contact with other contact areas of the run-up contour.

In a second exemplary embodiment, the second plane, in which the switching contacts are aligned, extends aslant to the direction of motion of the switch. The third plane, in which the run-up contour of the counter contact is located, would then be arranged transversely to the direction of motion of the switch. To close the switch, a first switching contact projecting further in the direction of the counter contact would first make contact with a first contact area of the transverse run-up contour before the other switching contacts make contact with other contact areas of the run-up contour.

According to another preferred embodiment of the invention, it is proposed that the switching contacts are spaced apart in a first plane. The first plane extends, for instance, in parallel to an extension plane of a flat counter contact and in parallel to a direction of motion of the switch (when traveling between the switched-off and the switched-on position). To close the switch, the switching contacts are pushed in the direction of motion across the run-up surface onto the surface of the counter contact. The switching contacts are also oriented in a second plane which extends transversely or aslant to a direction of motion of the switch and perpendicular to the first plane. On its end facing the switched-off position, the counter contact has a stepped run-up contour with respect to the second plane. Preferably, one step each of the step-shaped run-up contour is assigned to each of the switching contacts. To close the switch, a first switching contact would first make contact with a contact area in the area of a first step of the run-up contour projecting further in the direction of the switched-off position of the switch before the further switching contacts make contact with other contact areas in the area of further set-back steps of the run-up contour.

The concept according to the invention can theoretically be applied to switches, in particular slide switches, having die-cut metal contacts, which are, for instance, secured or attached to a plastic substrate. However, particularly preferably the switch is implemented on a printed circuit board (so-called PCB), wherein the counter contact is designed as a conductive track on the circuit board, preferably having a thickness of an electrically conductive material (e.g., copper) of the conductive track of less than 100 µm, in particular in a range from 35 to 70 µm. This invention can be used to ensure a constant contact resistance over the service life of the switch even for such a thin counter contact.

Furthermore, the switch is advantageously designed as a toggle switch and in a direction of motion of the switch has a counter contact to both sides of the switched-off position. One of the counter contacts forms a so-called Normally Open (NO) contact, and the other counter contact forms a so-called Normally Closed (NC) contact. I.e., the switch has two switch points, an ON-switch point on the NO contact and an OFF-switch point on the NC contact. Such switches are regularly used in electrical appliances, in particular in power tools. The NC contact can be used to generate a "safe OFF" signal for the control electronics or to initiate braking of the controlled electric motor. Such a switch therefore has two active positions, i.e., an active ON position and an active OFF position.

In the case where the counter contact(s) of the switch is/are formed as conductive tracks on an electrical printed circuit board (PCB), according to a preferred embodiment of the invention it is proposed that the PCB has a recess or slot in an area corresponding to the switched-off position of the switch. The slot is in particular formed between the two counter contacts in a switch designed as a toggle switch. During operation of the switch, particles, abrasion or erosion (e.g., material transference because of electro-erosion or mechanical material abrasion of the switching contacts on the counter contact) can form and deposit between the counter contacts, impairing the function of the switch, for instance because they cause leak currents. These particles and micro-particles can be removed from the area of the switched-off position through the recess or slot provided in the circuit board. In this way, the isolation performance of the switch can be improved and leak currents are prevented.

To improve the service life and the switching performance of the switch, it is proposed to provide the run-up contour of the counter contact with an additional coating of electrically conductive material, in particular copper, silver, gold or similar, at least in a contact area where a first switching contact first makes electrical contact with the counter contact. Preferably, the additional coating has a thickness of more than 100 μm, in particular at most 1 mm, preferably approx. 0.2 mm. The additional coating can, for instance, be designed as a welded or soldered contact plate. Such a switch is also suitable for long-term and frequent switching of higher currents and power, as may occur, for instance, when charging an electrolytic capacitor of control electronics (approx. 1.0 A). In the case of counter contacts having a typical copper thickness of approx. 35 μm applied as conductive tracks on a printed circuit board, contact erosion causes a copper loss of size X at a copper thickness of 35 μm every time the switch is switched on in the direction of motion of the switch, causing an undesirable extension of the switch-on travel. For an additional coating of approx. 0.2 mm thickness, the copper volume available at the switch point is increased 5.7-fold. I.e., the switch-on travel extension is only approx. 20% of the original value X for a conventional copper thickness. For the coating having a thickness of 0.2 mm, a reduction of the switch-on travel extension of approx. 80% can be achieved in this way. In this way, even very tightly specified switch-on and switch-off travel tolerances (e.g., of +/−0.2 mm for a switching travel of 1.8 mm) can be maintained over a large number of switching cycles 500,000 at currents of 0.1 to 20 mA, briefly up to more than 1 A.

The switch according to the invention can, for instance, be designed as a rotary slide switch, wherein the counter contact is shaped like a circular arc and the switching contacts can be moved about an axis of rotation, which passes through a center point of the counter contact shaped like a circular arc. Alternatively, the switch can also be designed as a linear slide switch, wherein the counter contact is linear and the switching contacts can be moved on a slide axis in parallel to a longitudinal extension of the counter contact.

The switch or slider of a switch designed as a slide switch preferably has exactly two switching contacts. That is a good compromise between achieving a constant contact resistance on the one hand and a high stability and robustness of the switch on the other hand. All in all, the result is a switch having a significantly improved switching performance and service life.

The invention also relates to an electrical appliance, in particular an electrical tool, having a switch of the type described above for switching the electrical appliance or an electrical load on and off, in particular an electric motor, of the electrical appliance.

Further features and advantages of this invention are explained in more detail below with reference to the Figures. In the Figures.

Figure 1:
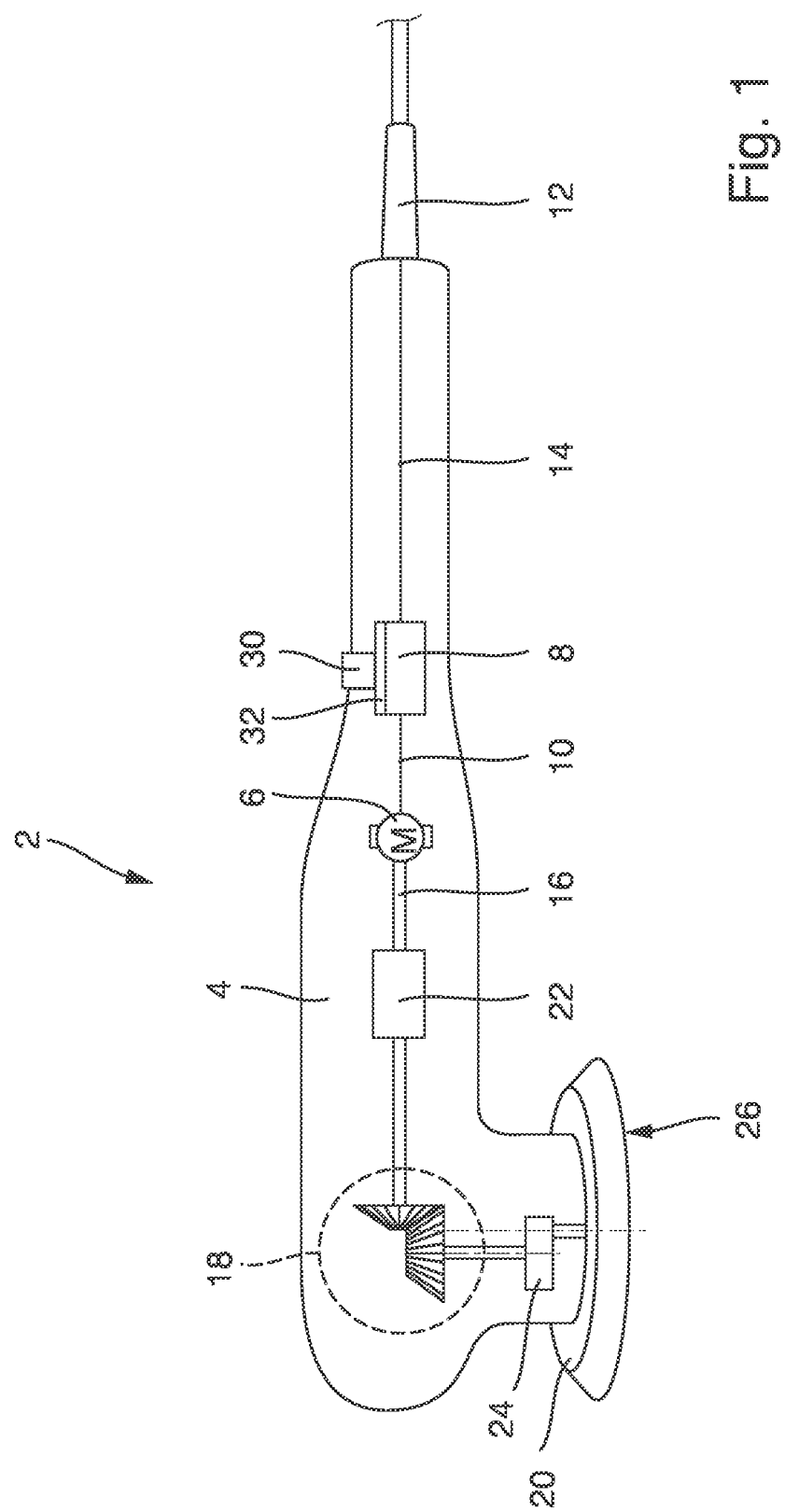
FIG. 1 shows an exemplary embodiment of an electrical device in the form of a power tool.

In FIG. 1, an electrical appliance according to the invention is partially shown in sectional view and is designated in its entirety by the reference numeral 2. In this example, the electrical appliance 2 is designed as an electrical tool, in particular as a random orbital polisher or random orbital sander. The electrical appliance 2 has a housing 4, which is made of plastic, for instance. An electric motor 6 is located in the housing 4, which electric motor is supplied with electric current by an electric control unit (ECU) 8 via one or more electric lines 10. An electrical cable 12 is used to feed the current for supplying the motor 6, the control unit 8 and possibly other electrical components of the electrical appliance 2 to the electrical appliance 2, which cable is introduced into the rear of the housing 4. Strands 14 of the cable 12 are connected to the control unit 8. The control unit 8 comprises, for instance, an electrical control circuit, which is used to commutate a brushless electric motor 6.

When current is supplied to the motor 6 via the line 10, it rotates a motor shaft 16, which rotary motion is transmitted to a backing pad 20 via a miter gear 18. A reduction gear 22 can be arranged between the motor 6 and the miter gear 18 to reduce the rotational speed and increase the torque. An eccentric 24 can be arranged between the miter gear 18 and the backing pad 20, to implement an eccentric motion (e.g., random-orbital, roto-orbital or gear-driven) of the backing pad 20. A polishing agent (e.g., foam sponge, microfiber or wool pad) or an abrasive (e.g., sandpaper, textile abrasive material) can be detachably attached to a flat underside 26 of the backing pad 20, for instance by means of a hook-and-loop fastener.

The electrical appliance 2 has a switch 30 according to the invention, which is arranged so as to be accessible to a user of the electrical appliance 2 at least indirectly from the outside of the housing 4. The switch 30 can be used to switch on the electrical appliance 2 (the line 10 supplies the motor 6 with power) and off (the power supply to the motor 6 is interrupted). On the other hand, if the switch 30 also has a controller, the controller can be used to set a rotational speed of the electric motor 6 by varying the current supplied to the motor 6 via the line 10 using a potentiometer. The control unit 8 preferably has an electrical circuit board (PCB) 32, on which the switch 30 is mounted and electrically contacted. The printed circuit board 32 is made of an electrically insulating material and is equipped with conductive tracks and, apart from the switch 30, usually with other electrical components (e.g., plugs, capacitors, coils, diodes, transistors, thyristors, potentiometers). Of course, the electrical appliance 2 can also be designed as any other electrical appliance having an electric load that is switched by the switch 30 according to the invention.

Figure 2:
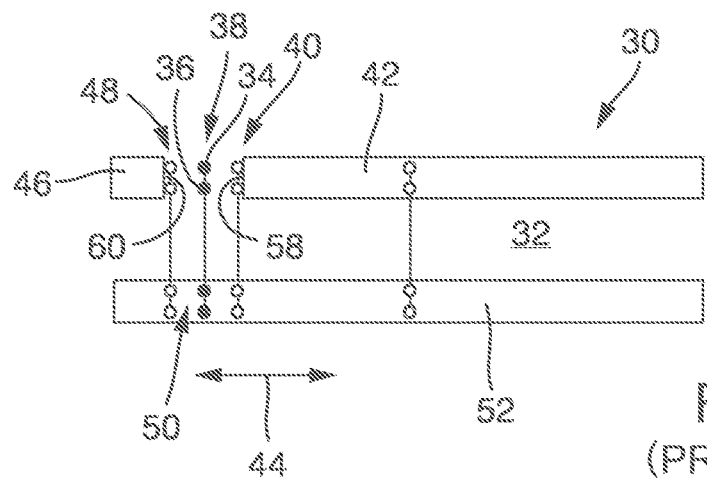
FIG. 2 shows a schematic representation of a switch known from the state of the art.
Figure 3:
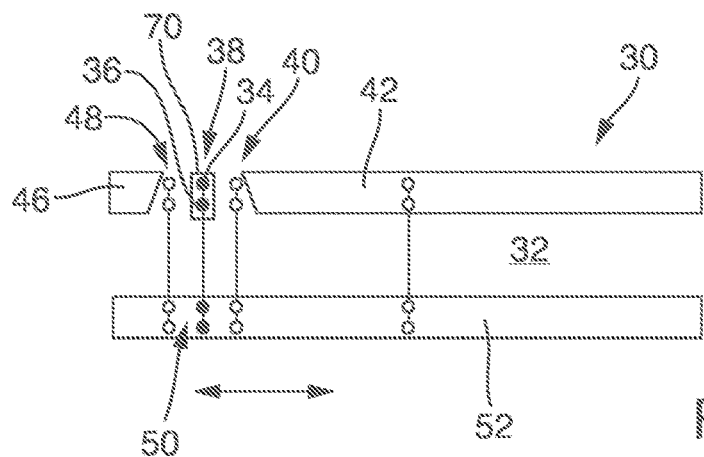
FIG. 3 shows a schematic representation of a first exemplary embodiment of a switch according to the invention.

FIG. 2 shows a switch 30 known from the state of the art as it is currently used in electrical appliances, e.g., the power tool 2. The switch 30 is designed as a slide switch and has two switching contacts 34, 36 (so-called double slider contact), which can be jointly moved at least between a switched-off (neutral) position 38 and a switched-on (active) position 40. In the switched-off position 38, the switching contacts 34, 36 are not electrically connected to a counter contact 42 of the switch 30. In the switched-on position 40, the two switching contacts 34, 36 are electrically connected to the counter contact 42. The transition between the switched-off position 38 and the switched-on position 40 is also called ON switch point.

In the example shown, the switch 30 is designed as a toggle switch and in a direction of motion 44 of the switch 30 has a counter contact 42, 46 to both sides of the switched-off position 38. The one counter contact 42 forms a so-called Normally Open (NO) contact. The other counter contact 46 forms a so-called Normally Closed (NC) contact. The switch 30 shown therefore has two switch points, an ON-switch point at the counter contact 42 and an OFF-switch point at the counter contact 46. Such switches 30 having an NO contact 42 and an NC contact 46 are often used in electrical appliances, in particular in power tools, to be able to transmit a signal to the control unit 8 as soon as the switching contacts 34, 36 are electrically connected to the NC contact 46 and the switch 30 is therefore safely switched off. From the switched-off position 38, the switching contacts 34, 36 can thus not only be moved to the switched-on position 40 against the NO contact 42, but also in the direction of the NC contact 46 to a further (active) position 48.

The two switching contacts 34, 36 are interconnected in an electrically conductive manner and are part of a slider, the opposite end 50 of which is electrically connected to a slider track 52. The switch 30 thus makes contact between the slider track 52 and the NO contact 42 or the NC contact 46 (in the positions 40, 48) or breaks contact (in the position 38).

The problem with the known switch 30 shown in FIG. 2 is that when the electrical contact between the slider (switching contacts 34, 36) and one of the counter contacts 42, 46, in particular the NO contact 42, is made or broken, switching sparks, arcs and harmful electroerosion (e.g. contact erosion) can occur at the switch points because of the relatively high currents to be switched, which leads in a disadvantageous way to an increase of the contact resistance and to a lengthening of the switch-on travel of the switch 30. With the known switches 30, both switching contacts 34, 36 make or break simultaneously, i.e., contact erosion occurs equally at both switching contacts 34, 36 or at the matching areas of a run-up contour 58, 60 of the counter contacts 42, 46. This results in a change of the contact resistance and a relatively short life or low switching capacity of the switch 30.

To keep the contact resistance of the switch 30 as constant as possible over the entire service life of the switch and to extend the service life of the switch 30, the invention proposes that the switching contacts 34, 36 and/or one or both of the counter contacts 42, 46 are arranged and/or formed in such a way that the switching contacts 34, 36 successively enter into an electrical contact with the matching counter contact 42 or 46 or successively break the electrical contact at the switch points of the switch 30 during a transition between the switched-off (inactive) position 38 and one of the active positions 40, 48. The explanations below regarding the design of the counter contact 42 at the ON switch point also apply in the same way to the design of the counter contact 46 at the OFF-switch point, even if this is not explicitly mentioned. In the case of a toggle switch, the switch 30 is preferably designed such that the same switching contact 34 from the switched-off position 38 is the first to make contact with the run-up contour 58 of the first counter contact 42 for switching on and with the run-up contour 60 of the other counter contact 46 for switching off.

The invention can be implemented in many ways. For instance, the arrangement of the switching contacts 34, 36 in a direction of motion 44 of the switch 30 (see FIGS. 7 and 8) can be changed with respect to the contact surface 58, 60 of the counter contact 42, 46 in such a way that a successive or gradual contacting of the switching contacts 34, 36 is achieved. The design of the switching contacts 34, 36 or their switch surfaces can also be varied with respect to the matching contact areas 62, 64, 66, 68 of the counter contact 42 or 46 with which the switch surfaces of the switching contacts 34, 36 come into contact. Furthermore, the arrangement and/or design of the contact areas 62, 64, 66, 68 (or the contact surfaces 58, 60) of the counter contact 42 or 46 (see FIGS. 3 to 6) can be varied or adjusted with regard to the switching contacts 34, 36 or their switch surfaces.

The switch 30 according to the invention preferably has a regulator (not shown) for adjusting the current supply to an electric load, in particular for adjusting the rotational speed of the electric motor 6 of the electrical appliance 2. The switch 30 has the slider having the switching contacts 34, 36 which are designed as sliding contacts. The slider can be moved between the switched-off position 38, in which the slider 34, 36 has no electrical connection with the counter contacts 42, 46, and an active position 40, 48, in which the slider 34, 36 is electrically connected to the counter contact 42 or the counter contact 46. The sliding contacts 34, 36 and/or the counter contacts 42, 46 are arranged and/or designed in such a way that at the ON switch point the sliding contacts 34, 36 are successively connected to the counter contact 42 or 46 into an electrical contact (when moving the switch 30 to one of the active positions 40, 48) or successively break the electrical contact (when moving the switch to the switched-off position 38) at a transition of the sliding contact 34, 36 between the switched-off position 38 and the switched-on position 40 and at the OFF switch point at a transition of the sliding contact 34, 36 between the switched-off position 38 and the active switched-off position 48.

The counter contacts 42, 46 and the slider track 52 are preferably applied on the surface of a printed circuit board, e.g., the printed circuit board 32 of the control electronics 8, as conductive tracks. An electrically conductive material, e.g., copper, of the conductive tracks preferably has a thickness of less than 100 µm, in particular in a range from 35 to 70 µm. A surface extension of the counter contacts 42, 46 and the slider track 52 thus extends in parallel to the surface of the PCB 32 in the drawing plane of FIGS. 3 to 8 (first plane). The motion direction 44 of the switch 30 extends in the or in parallel to the drawing plane. Based on the example of FIGS. 3 and 4 it is suggested that the switching contacts 34, 36 are spaced apart in the first plane. The switching contacts 34, 36 are also aligned in a second plane 54, which is transverse to the direction of motion 44 of the switch 30 and perpendicular to the first plane. On their ends facing the switched-off position 38 of the switch 30, the counter contacts 42 and 46 have run-up contours 58 and 60, respectively, in a third plane 56, which extends aslant to the direction of motion 44 of the switch 30 and perpendicular to the first plane. The second plane 54 and the third plane 56 extend aslant to each other.

Figure 9A:
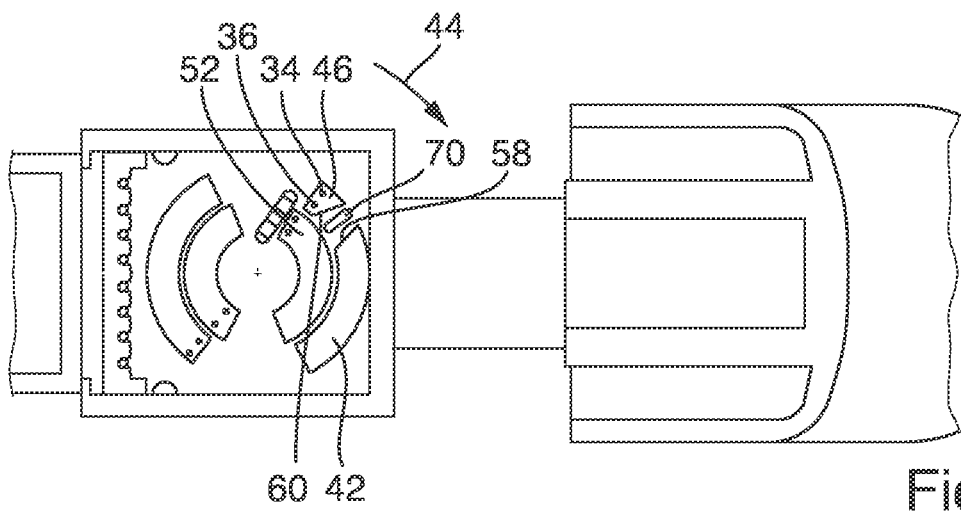
FIGS. 9a to 9f show a switch according to the invention in the form of a rotary switch.
Figure 9B:
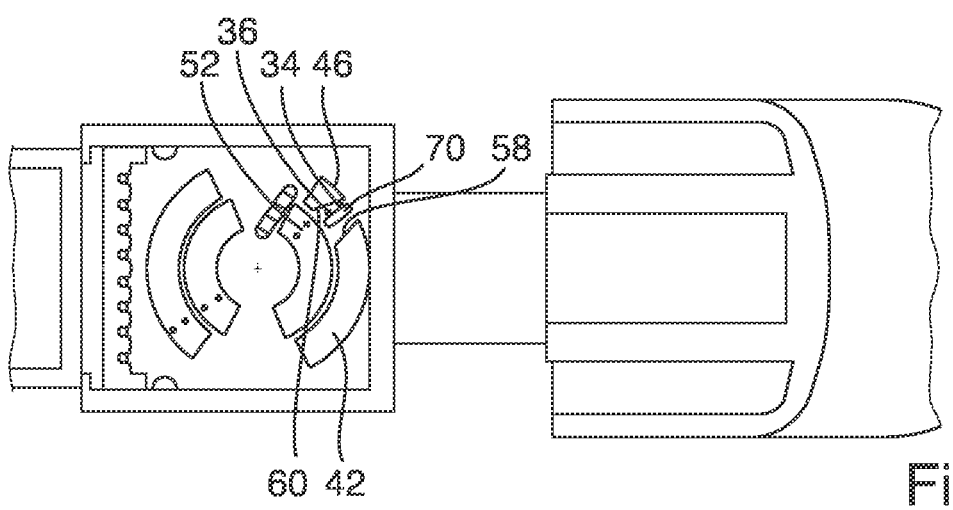
Figure 9C:
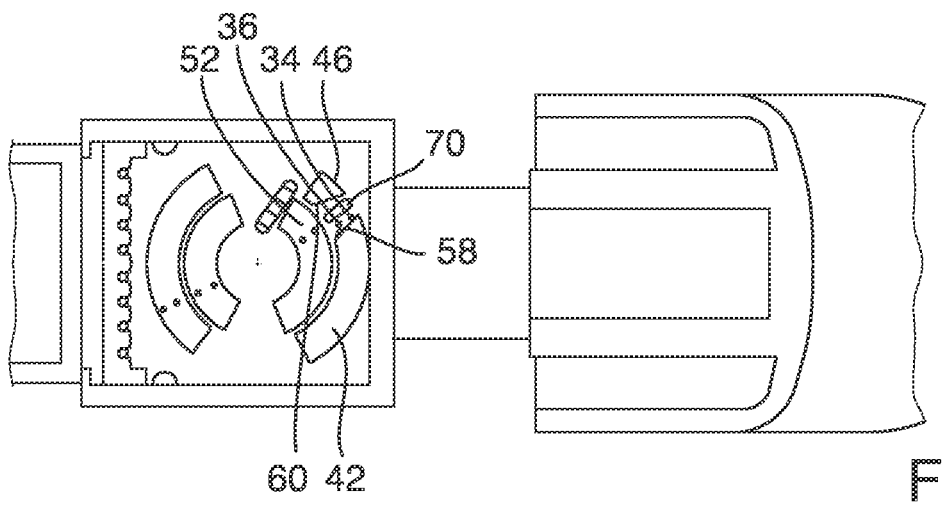
Figure 9D:
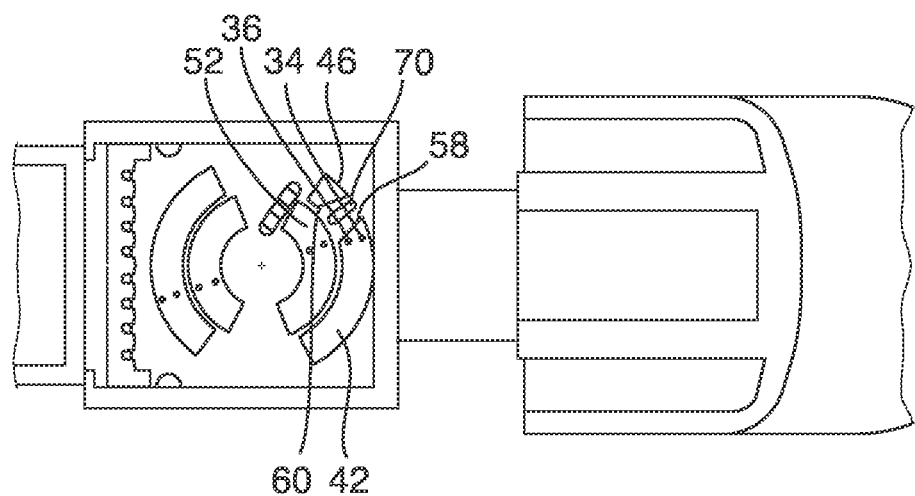
Figure 9E:
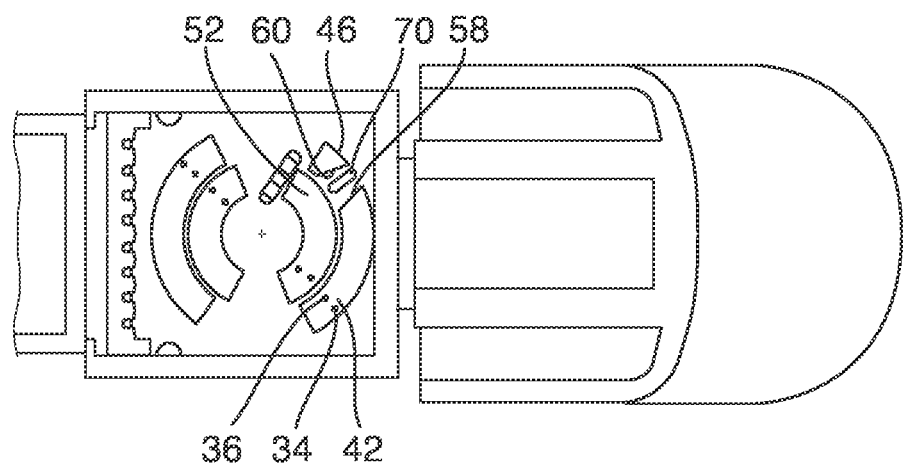
Figure 9F:
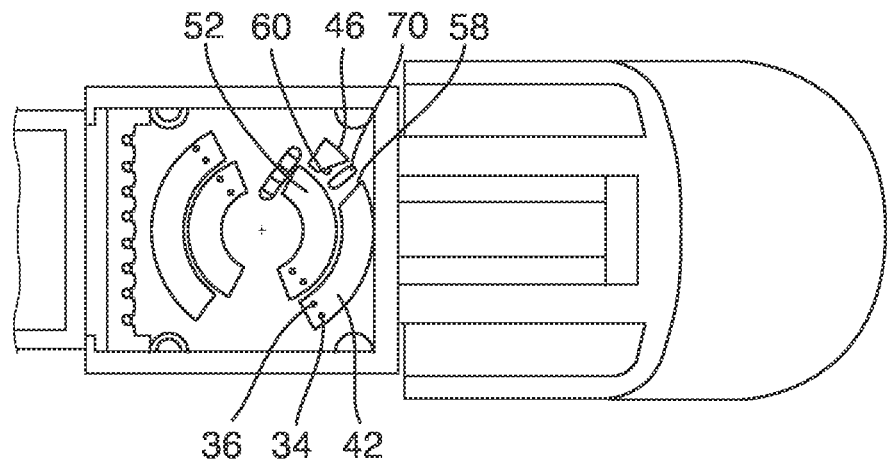
Figure 10A:
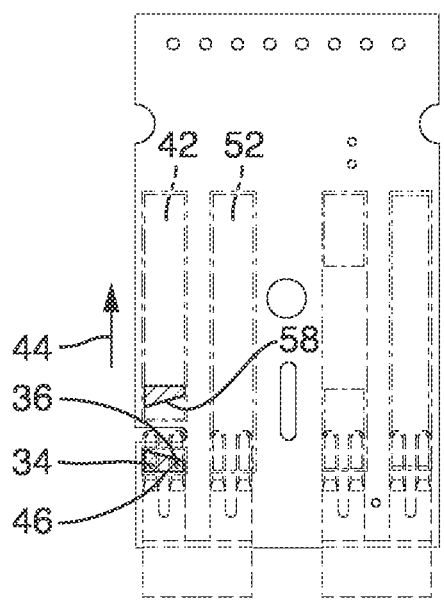
FIGS. 10a to 10f show a switch according to the invention in the form of a linear switch.
Figure 10B:
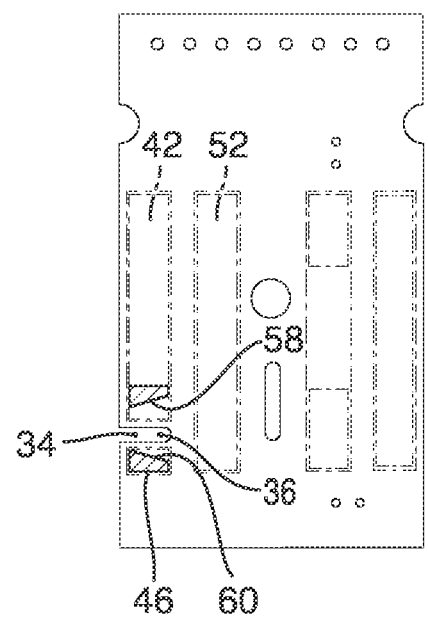
Figure 10C:
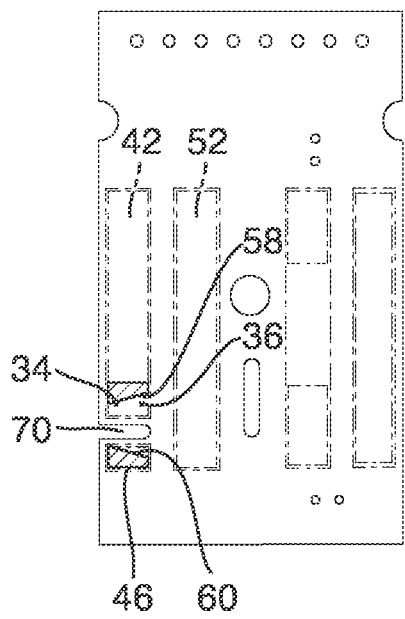
Figure 10D:
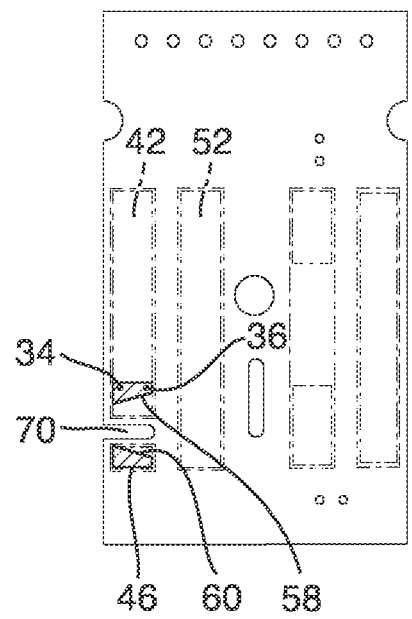
Figure 10E:
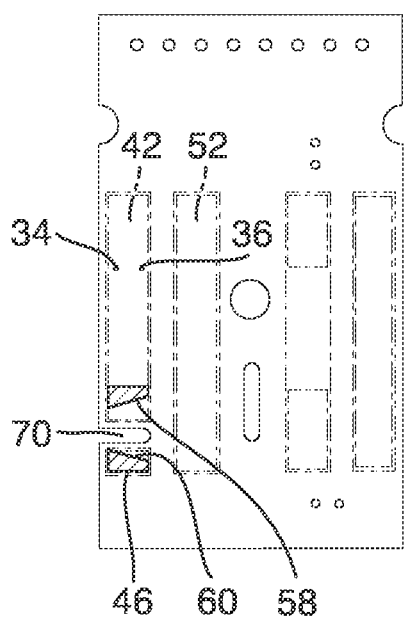
Figure 10F:
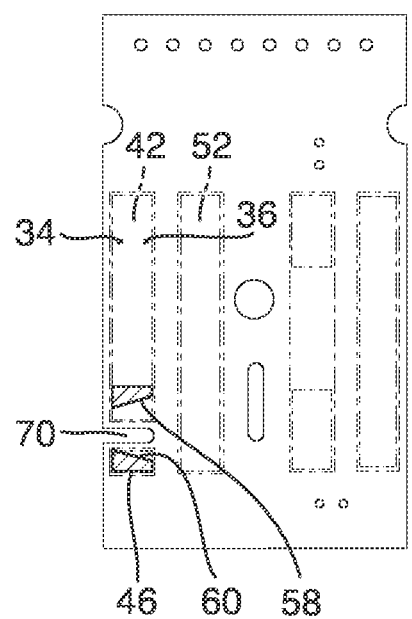

Moving the switch 30 from the active OFF switch position to the ON position is explained in more detail based on FIGS. 9a to 9f for a rotary switch and based on FIGS. 10a to 10f for a linear switch below. In FIGS. 9a and 10a, the switching contacts 34, 36 are both arranged on the NC counter contact 46 and are connected to the latter. In both cases, the switch 30 is in an active OFF switch position. If the switch 30 or the slider having the switching contacts 34, 36 is moved by approx. 1 mm in the marked actuating direction 44 (see FIGS. 9b and 10b), the end of the NC counter contact 46 is reached. When the switching contact 36 is just disconnected from the NC counter contact 46, the first switching contact 34 is still just connected to the NC counter contact 46. This position corresponds to the active position 48 of the switch 30 in FIGS. 2 to 8. If the switch 30 or the slider having the switching contacts 34, 36 is moved a further 1.1 mm (see FIGS. 9c and 10c), i.e., moved a total of approx. 2.1 mm, from the active OFF switch position, the start of the NO contact 42 has been reached. While the other switching contact 36 is not yet connected to the NO counter contact 42, the first switching contact 34 is already connected to the NO counter contact 42. This position corresponds to the active position 40 of the switch 30 in FIGS. 2 to 8. Therefore, the switch 30 in this example has a switch-on travel of 2.1 mm. If the switch 30 or the slider having the switching contacts 34, 36 is moved a further 0.6 mm (see FIGS. 9d and 10d), i.e., moved a total of approx. 2.7 mm from the active OFF switch position, the switch 30 is in an ON state. From this point onwards, the controller (potentiometer) of the switch 30 starts to adjust the rotational speed of the motor 6 (min. speed). If the switch 30 or the slider having the switching contacts 34, 36 is moved a further 4.8 mm (see FIGS. 9e and 10e), i.e., moved a total of approx. 7.5 mm from the active OFF switch position, the switch 30 is still in an ON state. At this point the control range of the controller of the switch 30 ends and the rotational speed of the motor 6 is set to its maximum value (max. speed). These 4.8 mm are therefore the control range in which the rotational speed of motor 6 can be varied between the minimum and the maximum value. If the switch 30 or the slider having the switching contacts 34, 36 is moved a further 0.8 mm or 1.0 mm (see FIGS. 9f and 10f), i.e., moved a total of approx. 8.3 mm or 8.5 mm from the active OFF switch position, switch 30 is at the end of its travel. Because the run-up contours 58, 60 of the counter contacts 42, 46 are aslant with respect to the direction of actuation 44, the switching contacts 34, 36 successively make contact with the counter contacts 42, 46 or successively break the electrical connection.

Figure 4:
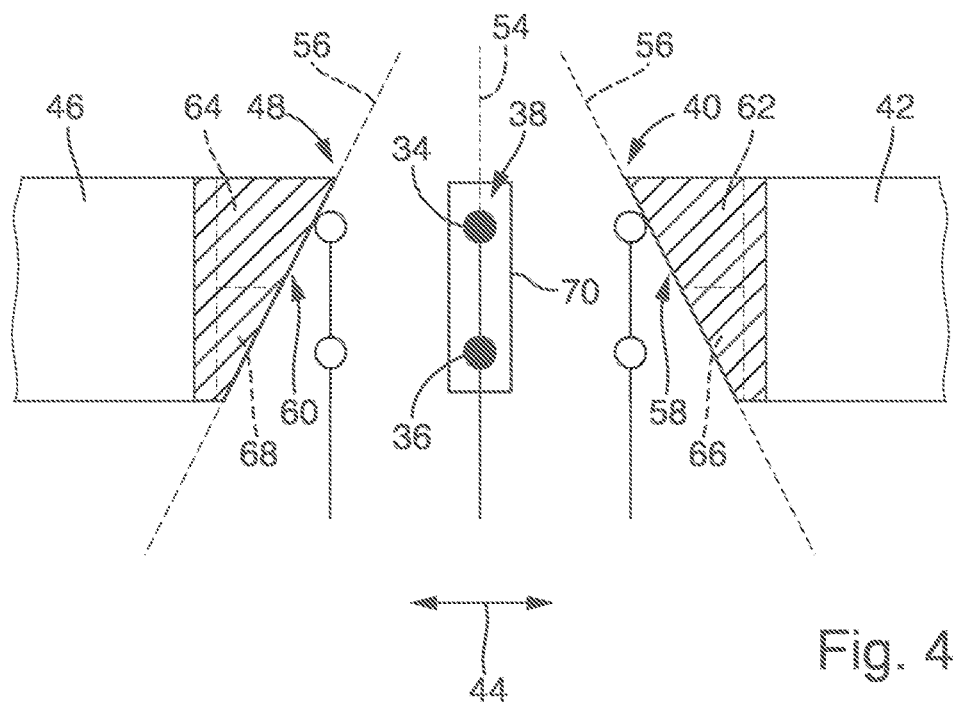
FIG. 4 shows an enlarged representation of a section of the switch of FIG. 3.

FIG. 4 shows clearly that when closing the switch 30 at the ON switch point 40, the first switching contact 34 first makes contact with a first contact area 62 of the slanted run-up contour 58, which projects further in the direction of the switched-off position 38 of the switch 30, before the further switching contact 36 makes contact with another contact area 66 of the run-up contour 58. Accordingly, at the OFF-switch point 48, the first switching contact 34 first makes contact with a first contact area 64 of the slanted run-up contour 60, which projects further in the direction of the switched-off position 38 of the switch 30, before the further switching contact 36 makes contact with another contact area 68 of the run-up contour 60. When the second switching contact 36 makes contact with a counter contact 42; 46, the electrical connection between the sliding contact 52 and the matching counter contact 42; 46 is already established, such that arcing and electric discharge cannot occur at the further switching contact 36.

Figure 7:
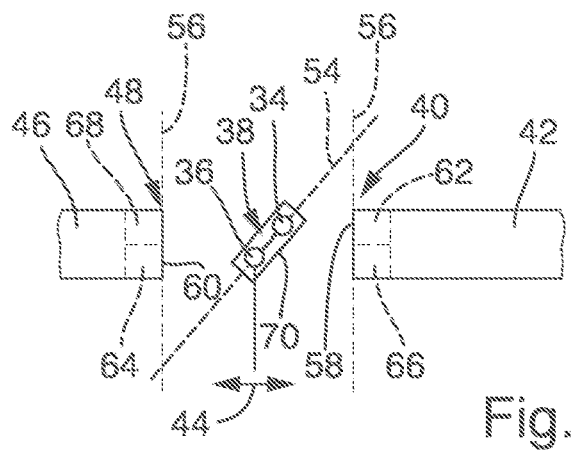
FIG. 7 shows an enlarged schematic representation of a section of a third exemplary embodiment of a switch according to the invention.
Figure 8:
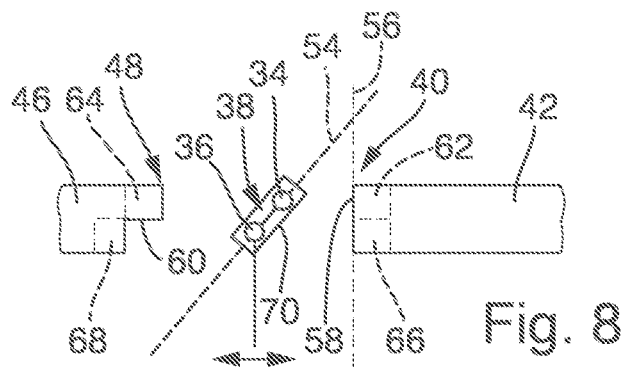
FIG. 8 shows an enlarged schematic representation of a section of a fourth exemplary embodiment of a switch according to the invention.

Of course, it would also be conceivable that the second plane 54 extends aslant to the direction of motion 44 of the switch 30 and perpendicular to the first plane (cf. FIGS. 7 and 8). The third plane 56, in which the run-up contour 58, 60 of the counter contact 42, 46 is located, can then extend transversely or aslant to the direction of motion 44 of the switch 30 and perpendicularly to the first plane. Here too, the second plane 54 and the third plane 56 extend aslant to each other. In the examples of FIGS. 7 and 8, the slider is designed having an asymmetric shape, wherein one of the sliding contacts 34, 36 protrudes somewhat further in the direction of motion 44 in the direction of the counter contact 42 and is thus designed to be longer or leading in this direction. The run-up contours 58, 60 at the ON and OFF switch points 40, 48 are straight. For the variant of FIG. 7, the first switching contact 34 is the first to make contact with the NO contact 42 and the other switching contact 36 is the first to make contact with the NC contact 46. For this design, the process of establishing the contacts at the switch points 40, 48 is therefore successive, too.

In the variant shown in FIG. 8, the run-up contour 60 of the counter contact 46 is stepped, such that an upper step having the contact area 64 projects further in the direction of the slider or the counter contact 42. This ensures that, despite the asymmetry of the slider, the first switching contact 34 is not only the first to make contact with the counter contact 42 at the ON switch point 40, but also the first to make contact with the counter contact 46 at the OFF-switch point 48.

Figure 5:
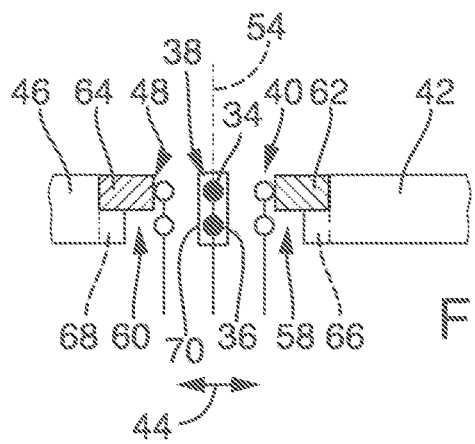
FIG. 5 shows an enlarged schematic representation of a section of a second exemplary embodiment of a switch according to the invention.
Figure 6:
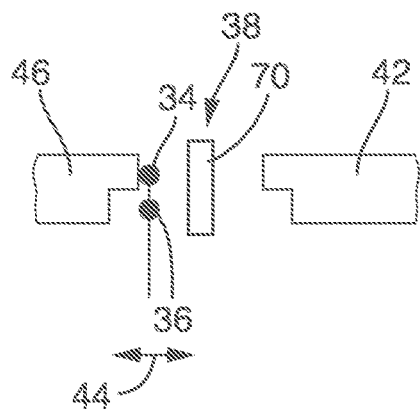
FIG. 6 shows the section of the switch of FIG. 5.

In the examples of FIGS. 5 and 6, the switching contacts 34, 36 are spaced apart in the first plane (the drawing plane) and are aligned in the second plane 54, which extends transversely to the direction of motion 44 of the switch 30 and perpendicular to the first plane. The counter contacts 42, 46 each have a stepped run-up contour 58, 60 on their end facing the switched-off position 38 with respect to the first plane 54. In particular, one contact area 62, 64 assigned to the first switching contact 34 projects further in the direction of the slider than the other contact area 66, 68, which is assigned to the other switching contact 36. The second plane 54, in which the switching contacts 34, 36 are aligned, could also extend aslant to the direction of motion 44 of the switch 30 (see FIG. 8). Preferably, one step each of the step-shaped run-up contour 58, 60 is assigned to each of the switching contacts 34, 36.

When the switch 30 is moved to the active ON switch point, the first switching contact 34 first makes contact with the contact area 62 of the first step of the run-up contour 58, which projects further towards the switched-off position 38 of the switch 30, before the other switching contact 36 makes contact with the other contact area 66 of the other step of the run-up contour 58. Correspondingly, when the switch 30 is moved to the active OFF switch point, the first switching contact 34 first makes contact with the contact area 64 of the first step of the run-up contour 60, which projects further towards the switched-off position 38 of the switch 30, before the other switching contact 36 makes contact with the other contact area 68 of the other step of the run-up contour 60.

Preferably the printed circuit board on which the counter contacts 42, 46 and the slider track 52 are applied as conductive tracks, e.g., the printed circuit board 32 of the control electronics 8 of the electrical appliance 2, has a recess or slot 70 between the two counter contacts 42, 46 in an area corresponding to the switched-off position 38 of the switch 30. The recess or slot 70 is best seen in FIG. 6 where the sliders 34, 36 are moved to the side away from the recess or slot 70. The location of the recess or slot 70 is also schematically seen in the embodiments of FIGS. 3-5 and 7-8 as the rectangular outline 70 in the area corresponding to the switched-off position 38. During operation of the switch 30, particles and abrasion (e.g., material transference due to electro-erosion or mechanical material abrasion) can form inside the switch 30, which can cause leak currents. These particles and the abrasion can be removed from the area of the switched-off position 38 through the slot 70 provided in the circuit board 32. This improves the isolation values of the switch 30.

To further improve the service life and the switching capacity of the switch 30, it can be advantageous to provide the run-up contour 58 of the counter contact 42 with an additional coating of electrically conductive material, in particular copper, at least in the first contact area 62, in which the first switching contact 34 first makes electrical contact with the counter contact 42 (see hatched areas in FIGS. 4, 5 and 10). In the same way, the run-up contour 60 of the counter contact 46 can also be provided with an additional coating of electrically conductive material, in particular copper, at least in the first contact area 64, in which the first switching contact 34 is the first to make electrical contact with the counter contact 46. Preferably, the additional coating has a thickness of more than 100 μm, in particular at most 1 mm, preferably approx. 0.2 mm. The additional coating can, for instance, be designed as a welded or soldered contact plate. Such a switch 30 is also suitable for higher currents and powers, as they can occur temporarily, for instance, when a capacitor of the control electronics 8 has to be charged during the first switch-on process of a series of switching cycles.

The switch 30 according to the invention can be designed as a linear slide switch (see FIGS. 10a to 10f), wherein the counter contacts 42, 46 are linear and a sliding axis of the slider 34, 36 extends in parallel to a longitudinal extension of the counter contacts 42, 46. Alternatively, the switch 30 can also be designed as a rotary slide switch (see FIGS. 9a to 9f), wherein the counter contacts 42, 46 are arranged on an arc of a circle and a rotational axis of the slider 34, 36 passes through a center point of the arc. On the right-hand side of each of FIGS. 9a-9f a slider can be seen in a series of successive positions as the slider is moved towards the rotary component of the rotary slide switch. On the left-hand side of each of FIGS. 9a-9f the rotary component of the rotary slide switch is seen in a series of successive positions in which the sliders 34 and 36 move in a clockwise direction along circular arcs along the contacts 42, 46.

The invention claimed is:

1. An electrical switch for an electrical appliance, the electrical switch comprising:
   an electrical printed circuit board including first and second counter contacts formed as conductive tracks on the electrical printed circuit board, the electrical printed circuit board including a recess or slot between the first and second counter contacts;
   at least two jointly movable switching contacts movable in a direction of motion relative to the counter contacts between a switched-off position in which the switching contacts are located adjacent the recess or slot and have no electrical connection to the first counter contact, and a switched-on position in which the switching contacts are electrically connected to the first counter contact; and
   wherein the switching contacts and the first counter contact are arranged and constructed such that, when the switching contacts are moved from the switched-off position to the switched-on position the switching contacts successively enter into electrical contact with the first counter contact, and when the switching contacts are moved from the switched-on position to the switched-off position the switching contacts successively break the electrical contact with the first counter contact.

2. An electrical appliance, comprising:
   an electric load;
   control electronics configured to switch the electric load; and
   an electrical toggle switch configured to switch a signal current for the control electronics, the electrical toggle switch including:
      first and second counter contacts formed on a printed circuit board, the printed circuit board including a recess or slot between the first and second counter contacts;
      at least two jointly movable switching contacts movable from a switched-off position located between the first and second counter contacts to a switch-on position wherein the switching contacts contact the first counter; and
      wherein the switching contacts and the first counter contact are arranged and constructed such that, when the switching contacts are moved from the switched-off position to the switched-on position the switching contacts successively enter into electrical contact with the first counter contact, and when the switching contacts are moved from the switched-on position to the switched-off position the switching contacts successively break the electrical contact with the first counter contact.

3. The electrical appliance of claim 2, wherein:
   the switching contacts are arranged spaced apart in a first plane, the first plane extending in parallel to an extension plane of the first counter contact and in parallel to the direction of motion;
   the switching contacts are aligned in a second plane which second plane is transverse or slanted to the direction of motion and perpendicular to the first plane;
   the first counter contact includes a run-up contour on an end facing the switched-off position, the run-up contour extending in a third plane transverse or slanted to the direction of motion and perpendicular to the first plane; and
   wherein the second plane and the third plane are slanted relative to each other.

4. The electrical switch of claim 2, wherein:
   the switching contacts are arranged spaced apart in a first plane, the first plane extending in parallel to an extension plane of the first counter contact and in parallel to the direction of motion;
   the switching contacts are aligned in a second plane which second plane is transverse or slanted to the direction of motion and perpendicular to the first plane; and
   the first counter contact includes a stepped run-up contour on an end facing the switched-off position.

5. An electrical switch for an electrical appliance, the electrical switch comprising:
   at least two jointly movable switching contacts;
   a first counter contact formed as a conductive track on a printed circuit board;
   wherein:
   the switching contacts are movable in a direction of motion relative to the first counter contact between a switched-off position in which the switching contacts have no electrical connection to the first counter contact, and a switched-on position in which the switching contacts are electrically connected to the first counter contact;
   the switching contacts and the first counter contact are arranged and constructed such that when the switching contacts are moved from the switched-off position to the switched-on position the switching contacts successively enter into electrical contact with the first counter contact, and when the switching contacts are moved from the switched-on position to the switched-off position the switching contacts successively break the electrical contact with the first counter contact;
the switch is configured as a toggle switch and in the direction of motion the switch includes a second counter contact on an opposite side of the switched-off position from the first counter contact; and
the printed circuit board includes a recess or a slot in an area corresponding to the switched-off position.

6. The electrical switch of claim 5, wherein:
the switch is configured as a signal switch to interact with control electronics of the electrical appliance and to switch a signal current for the control electronics, which signal current in turn switches an electric load of the electrical appliance.

7. The electrical switch of claim 5, further comprising:
a regulator configured to adjust a current supply to an electrical load of the electrical appliance.

8. The electrical switch of claim 5, wherein:
the switching contacts are arranged spaced apart in a first plane, the first plane extending in parallel to an extension plane of the first counter contact and in parallel to the direction of motion;
the switching contacts are aligned in a second plane which second plane is transverse or slanted to the direction of motion and perpendicular to the first plane;
the first counter contact includes a run-up contour on an end facing the switched-off position, the run-up contour extending in a third plane transverse or slanted to the direction of motion and perpendicular to the first plane; and
wherein the second plane and the third plane are slanted relative to each other.

9. The electrical switch of claim 5, wherein:
the conductive track has a thickness of electrically conductive material in a range from 35 μm to 70 μm.

10. The electrical switch of claim 5, wherein:
the first counter contact is a circular arc-shaped first counter contact wherein the switching contacts can be moved about an axis of rotation, the axis of rotation passing through a center of the circular arc-shaped first counter contact.

11. The electrical switch of claim 5, wherein:
the first counter contact is linear wherein the switching contacts can be moved on a sliding axis extending in parallel to a longitudinal extension of the first counter contact.

12. The electrical switch of claim 5, wherein:
the switch includes exactly two switching contacts.

13. The electrical switch of claim 5, in combination with the electrical appliance, wherein:
the switch includes a slider carrying the at least two jointly movable switching contacts, the slider being movable between the switched-on position and the switched-off position to switch the electrical appliance on and off.

14. The electrical switch of claim 5, wherein:
the switching contacts are arranged spaced apart in a first plane, the first plane extending in parallel to an extension plane of the first counter contact and in parallel to the direction of motion;
the switching contacts are aligned in a second plane which second plane is transverse or slanted to the direction of motion and perpendicular to the first plane; and
the first counter contact includes a stepped run-up contour on an end facing the switched-off position.

15. The electrical switch of claim 14, wherein:
the stepped run-up contour includes at least two steps, each step being arranged to be engaged by a different one of the switching contacts.

16. The electrical switch of claim 5, wherein:
the first counter contact has a thickness of electrically conductive material of less than 100 μm.

17. The electrical switch of claim 16, wherein:
the first counter contact includes a run-up contour on an end facing the switched-off position, the run-up contour including an additional coating of electrically conductive material at least in a contact area where a first one of the switching contacts first makes electrical contact with the first counter contact.

18. The electrical switch of claim 17, wherein:
the additional coating is formed of copper, silver or gold.

19. The electrical switch of claim 17, wherein:
the additional coating has a thickness of more than 0.1 mm and less than 1 mm.

20. The electrical switch of claim 19, wherein:
the additional coating has a thickness of approximately 0.2 mm.

* * * * *